US012747843B2

(12) United States Patent
Delande et al.

(10) Patent No.: US 12,747,843 B2
(45) Date of Patent: Sep. 29, 2026

(54) LIGHT-EMITTING MODULE INTEGRATING A FLEXIBLE ORGANIC LIGHT-EMITTING DIODE

(71) Applicant: VALEO VISION, Bobigny (FR)

(72) Inventors: Benoit Delande, Bobigny (FR); Pascal Poirot, Bobigny (FR); Custodio Conde Gallardo, Bobigny (FR); Raul Jimenez, Martos (ES)

(73) Assignee: Valeo Vision, Bobigny (FR)

( * ) Notice: Subject to any disclaimer, the term of this patent is extended or adjusted under 35 U.S.C. 154(b) by 0 days.

(21) Appl. No.: 19/100,266

(22) PCT Filed: Jul. 13, 2023

(86) PCT No.: PCT/EP2023/069583
§ 371 (c)(1),
(2) Date: Jan. 31, 2025

(87) PCT Pub. No.: WO2024/028078
PCT Pub. Date: Feb. 8, 2024

(65) Prior Publication Data
US 2026/0071730 A1 Mar. 12, 2026

(30) Foreign Application Priority Data
Aug. 1, 2022 (FR) ....................................... 2207972

(51) Int. Cl.
*F21S 41/19* (2018.01)
*F21S 41/155* (2018.01)
(Continued)

(52) U.S. Cl.
CPC ............. *F21S 41/19* (2018.01); *F21S 41/155* (2018.01); *F21S 43/145* (2018.01); *F21S 43/19* (2018.01);
(Continued)

(58) Field of Classification Search
CPC ...... F21S 41/155; F21S 43/145; H10K 77/10; H10K 2102/3026; H10K 2102/311;
(Continued)

(56) References Cited

U.S. PATENT DOCUMENTS

2011/0101314 A1* 5/2011 Kim ..................... H10K 59/805 257/40
2013/0026513 A1* 1/2013 Aurongzeb ............. F21V 17/10 257/98
(Continued)

FOREIGN PATENT DOCUMENTS

CN 112283669 A * 1/2021 ............ F21S 43/145

OTHER PUBLICATIONS

Machine translation of CN 112283669 A retrieved from the FIT database of PE2E search. (Year: 2026).*
(Continued)

*Primary Examiner* — Colin J Cattanach
(74) *Attorney, Agent, or Firm* — Valeo Vision

(57) ABSTRACT

The invention relates to a luminous module of a luminous and/or signaling device of an automotive vehicle. The luminous module includes a flexible OLED mounted on a transparent substrate with an electrical interconnection layer, a support of the flexible OLED, designed to shape at least part of the flexible OLED and the transparent substrate in a predetermined shape, the flexible OLED being fastened to the support by means of an adhesive, and a flexible printed circuit board. The transparent substrate includes a portion protruding beyond the OLED and facing a portion of the support, in that the flexible printed circuit board is electrically connected to the interconnection layer at this portion of the transparent substrate and in that the flexible printed circuit board is fastened to this portion of the support by means of an adhesive.

8 Claims, 2 Drawing Sheets

(51) Int. Cl.

| | |
|---|---|
| ***F21S 43/145*** | (2018.01) |
| ***F21S 43/19*** | (2018.01) |
| ***F21Y 107/70*** | (2016.01) |
| ***F21Y 109/00*** | (2016.01) |
| ***F21Y 115/15*** | (2016.01) |
| ***H10K 50/842*** | (2023.01) |
| ***H10K 59/179*** | (2023.01) |
| ***H10K 59/80*** | (2023.01) |
| ***H10K 59/82*** | (2023.01) |
| ***H10K 59/88*** | (2023.01) |
| ***H10K 77/10*** | (2023.01) |
| ***H10K 102/00*** | (2023.01) |

(52) U.S. Cl.
CPC ......... *H10K 50/8426* (2023.02); *H10K 77/10* (2023.02); *F21Y 2107/70* (2016.08); *F21Y 2109/00* (2016.08); *F21Y 2115/15* (2016.08); *H10K 59/179* (2023.02); *H10K 59/82* (2023.02); *H10K 59/8722* (2023.02); *H10K 59/88* (2023.02); *H10K 2102/3026* (2023.02); *H10K 2102/311* (2023.02)

(58) Field of Classification Search
CPC ...... H10K 59/179; H10K 59/82; H10K 59/88; H10K 59/8722; H10K 50/8426; F21Y 2107/70; F21Y 2109/00; F21Y 2115/15
See application file for complete search history.

(56) References Cited

U.S. PATENT DOCUMENTS

| | | | | |
|---|---|---|---|---|
| 2013/0128199 | A1 | 5/2013 | Yamazaki et al. | |
| 2019/0157602 | A1 * | 5/2019 | Nakamura ............ | F21S 43/145 |
| 2020/0149703 | A1 * | 5/2020 | Kaneko ................. | F21S 43/145 |

OTHER PUBLICATIONS

European Patent Office, International Search Report (with English translation) and Written Opinion of corresponding PCT Application No. PCT/EP2023/069583, dated Sep. 21, 2023.

* cited by examiner

LIGHT-EMITTING MODULE INTEGRATING A FLEXIBLE ORGANIC LIGHT-EMITTING DIODE

TECHNICAL FIELD

The invention relates to the field of automotive lighting and automotive signaling. More precisely, the invention relates to the field of luminous and/or signaling devices incorporating organic light-emitting diodes.

BACKGROUND OF THE INVENTION

In automotive vehicles, it is common to use organic light-emitting diodes (OLEDs) to perform, or at least to participate in the performance of one or more lighting and/or signaling functions. Specifically, OLEDs offer many possibilities for shape and style, thus contributing to the esthetics of the vehicle and to its specific visual signature.

Conventionally, an organic light-emitting diode is in the form of a rigid surface light source which is mounted on a support which allows it to be integrated into a luminous and/or signaling device. A flexible printed circuit board, or flexboard, is thus mechanically fastened to the support and electrically connected to the OLED so as to be able to supply power to the latter and control it. The use of this flexible printed circuit board thus offers a great degree of freedom for arranging the OLED in the luminous and/or signaling device.

However, it is becoming common to use flexible organic light-emitting diodes which offer greater freedom for style and also make it possible to advantageously orient their emission surfaces so as to be able to improve their visibility from the outside of the vehicle, regard-less of the direction of observation.

However, it is necessary, on the one hand, to protect this type of flexible organic light-emitting diode, in particular from dust and moisture, and, on the other hand, to shape this flexible organic light-emitting diode so that it assumes the desired shape. In this context, it is conventional to attach the flexible OLED to a glass substrate, intended to protect said flexible OLED, and to fasten the assembly on a rigid support capable of shaping the flexible OLED.

There is then a problem in mechanically fastening the flexible printed circuit board to the OLED. Specifically, since the OLED is encapsulated between the glass substrate and the rig-id support, it is necessary to mechanically fasten the flexible printed circuit board to the glass substrate, the latter being provided with an interconnection layer allowing an electrical connection to the electrodes of the OLED. However, this fastening creates a mechanical stress on the glass substrate which may then be subjected to stress and crack. In this case, the crack may allow moisture to seep into the OLED and so the protective function of the glass substrate is no longer ensured. In addition, this crack has a detrimental effect on the esthetic appearance of the OLED and may also impair the light beam emitted by the OLED.

There is thus a need for a luminous module of a luminous and/or signaling device of an automotive vehicle incorporating a flexible organic light-emitting diode and overcoming the mentioned drawbacks, and in particular which integrates a flexible printed circuit board mechanically fastened to the module without the risk of weakening the protective substrate of the diode.

SUMMARY OF THE INVENTION

The present invention falls within this context, and aims to meet this need.

For these purposes, one subject of the invention is a luminous module of a luminous and/or signaling device of an automotive vehicle, comprising:

a. a flexible organic light-emitting diode mounted on a transparent substrate, said transparent substrate comprising an interconnection layer comprising a network of electrical tracks for supplying electrical power to the organic light-emitting diode;

b. a support of said flexible organic light-emitting diode, the support being designed to shape at least part of the flexible organic light-emitting diode and the transparent substrate in a predetermined shape; said at least part of the organic light-emitting diode being fastened to the support by means of an adhesive;

c. a flexible printed circuit board.

The luminous module is characterized in that the transparent substrate comprises a portion protruding beyond the organic light-emitting diode and facing a portion of the support, in that the flexible printed circuit board is electrically connected to the interconnection layer at this portion of the transparent substrate and in that the flexible printed circuit board is fastened to this portion of the support by means of an adhesive.

It is thus understood that the protective substrate of the OLED extends beyond the OLED to define a portion dedicated to the electrical connection between the flexible printed circuit board and the OLED. However, this portion plays substantially no role in mechanically holding this printed circuit board. An adhesive layer is thus provided between the flexible printed circuit board and the support of the OLED, which also extends beyond the OLED, so that the flexible printed circuit board is mechanically held on this support, and not on the protective substrate. Consequently, the mechanical stress to which this protective substrate is susceptible to be subjected due to the flexible printed circuit board is substantially eliminated, and the risk of this protective substrate cracking is thus minimized.

In the invention, the term "flexible organic light-emitting diode" is understood to mean an organic light-emitting diode which can be deformed without breaking, in particular by folding it or by bending it, and without substantially altering its light-emitting function.

For example, the flexible OLED may comprise a plurality of layers, including an organic lay-er surrounded by a cathode and an anode. The organic layer may comprise various strata made of different organic materials. For example, the organic layer may comprise a light-emitting stratum, a stratum promoting electron transport to the emitting stratum and a stratum promoting hole transport to the emitting stratum, a stratum blocking holes coming from the upper layers and a stratum blocking electrons coming from the lower strata. All of these strata thus constitute a microcavity the thickness of which is adjusted to create optical resonance. Thus, selective interference reflectors which constitute resonant cavities are produced.

Thus, when the organic layer is passed through by an electric current transmitted by the anode, an upper emitting surface of the emitting stratum emits light radiation propagating through the upper strata which are transparent with respect to this radiation, and a lower emitting surface of the emitting stratum emits light radiation propagating through the lower strata which are transparent with respect to this radiation. For example, provision could be made for one of the cathode and the anode to be made of a reflective material or else for a reflective coating to be applied to one of the cathode and the anode so as to reflect the light radiation toward the other of the cathode and the anode, which is made of a transparent conductive material, such as transparent indium tin oxide (ITO), in order to form a single light-emitting face of the OLED. The transparent substrate is thus attached to this light-emitting face. Provision could be made for an optical transfer layer between the transparent electrode and the transparent substrate.

If desired, the OLED could comprise a thermal interface layer via which the OLED is fastened to the support, the adhesive thus being arranged between this layer and the support.

By way of indication, the thickness of the OLED, that is to say of the electrodes, of the organic layer and of the thermal interface layer, could be less than 1 mm, in particular substantially equal to 200 μm, while the area of the light-emitting face could be greater than 1 $cm^2$, or greater than 10 $cm^2$. If necessary, the thickness of the transparent substrate could be substantially less than 1 mm, in particular substantially equal to 100 μm.

In the invention, the transparent substrate could advantageously be made, partially or totally, of glass. In a variant, the transparent substrate could be made of a transparent plastic polymer.

Advantageously, the support may be designed to shape at least part, or else all of the organic light-emitting diode and of the transparent substrate along a three-dimensional surface. The term "three-dimensional surface" is understood to mean a surface that is bent in at least one given direction, that is to say that three Cartesian coordinates are necessary to define each of the points of the surface, regardless of the reference system chosen. Advantageously, the predetermined shape is a ruled surface.

Preferably, the support comprises members for fastening the luminous module to the luminous and/or signaling device. For example, the support could comprise fastening brackets intended to be screwed or snap-fastened to a housing of the luminous and/or signaling device.

In the invention, the expression "flexible printed circuit board", also designated by the expression "flexible printed circuit", or else the term "flexboard", designates an assembly made up of an in particular flexible and planar electrically insulating support—also referred to as a flexible insulating support—and of in particular flat metal conductors intended to ensure transmission of electrical signals to the flexible organic light-emitting diode, and in particular transmission of electrical power for supplying electrical power to the flexible organic light-emitting diode and/or control signals for controlling the lighting of all or part of the flexible organic light-emitting diode.

Advantageously, the adhesive fastening the flexible printed circuit board to the support is identical to the adhesive fastening the organic light-emitting diode to the support.

For example, the adhesive may be a double-sided adhesive layer, such as a film or a tape. For example, said layer could comprise a core of acrylic foam coated on each side with an adhesive coating, these coatings possibly being identical or not. The foam core makes it possible to absorb mechanical stresses without the fastening function of the adhesive layer being impaired.

Preferably, the double-sided adhesive layer fastening the flexible printed circuit board to the support and the double-sided adhesive layer fastening the organic light-emitting diode to the support come from one and the same double-sided adhesive tape. It is thus under-stood that the thicknesses of these layers will be identical in this case. This feature makes it possible in particular to facilitate the manufacture of the luminous module and to avoid putting mechanical stresses on the transparent substrate, which could be the case if the adhesive layers at the OLED and the flexible printed circuit board have different thicknesses.

Advantageously, the organic light-emitting diode comprises a first light-emitting face, the transparent substrate covering this light-emitting face. If necessary, the organic light-emitting diode is mounted on the support via a second face opposite its first face, and the interconnection layer of the transparent substrate extends over that face of the transparent substrate situated on the side of the organic light-emitting diode.

Advantageously, the network of electrical tracks of the interconnection layer is laid on said face of the transparent substrate situated on the side of the organic light-emitting diode. For example, a layer of electrically conductive transparent material, such as indium tin ox-ide or ITO, may be deposited on said face of the transparent substrate, prior to assembly, and then be modified mechanically, optically or chemically, to form said network.

Preferably, said flexible printed circuit board is electrically connected to the interconnection layer by means of an anisotropic conductive adhesive connector arranged between an edge of said flexible printed circuit board and said portion of the transparent substrate. Thus, provision could be made for the connector to be an anisotropic conductive film (ACF) or an anisotropic conductive paste (ACP).

In one embodiment of the invention, the flexible organic light-emitting diode is mounted on a first area of the transparent substrate, and the flexible printed circuit board is electrically connected to the interconnection layer in a second area of the portion of the transparent substrate. If necessary, the first area and the second area are separated by a third area of the portion of the transparent substrate, the luminous module being devoid of adhesive between the support and the transparent substrate in the third area.

Specifically, it has been found that some adhesives may include corrosive components, such as chlorinated compounds. In this case, the adhesive used to fasten the flexible OLED and the flexible printed circuit board may be directly in contact with the transparent substrate in this third area, this potentially causing corrosion of this substrate and the appearance of cracks. Removing the adhesive in this third area thus makes it possible to prevent this corrosion.

Advantageously, provision could be made to deposit a single layer of double-sided adhesive over the entire support, then to remove part of this layer corresponding to the third area, before then bonding the flexible organic light-emitting diode and the flexible printed circuit board to the remaining layer.

Advantageously, said portion of the support forms a step with respect to the rest of the support. If the thickness of the OLED is different to the thickness of the printed circuit board, and possibly of the connector, while the thickness of the adhesive is constant, this thus ensures that this difference in thickness with respect to the transparent substrate is compensated for, so as to avoid creating mechanical stresses on this substrate.

A subject of the invention is also a luminous and/or signaling device of an automotive vehicle, comprising a luminous module according to the invention.

BRIEF DESCRIPTION OF DRAWINGS

The present invention is now described using examples that are only illustrative and in no way limit the scope of the invention, and with reference to the appended drawings, in which drawings the various figures show.

DETAILED DESCRIPTION OF THE INVENTION

Throughout the following description, elements that are identical in terms of structure or function and that appear in various figures retain the same references, unless specified otherwise.

Figure 1:
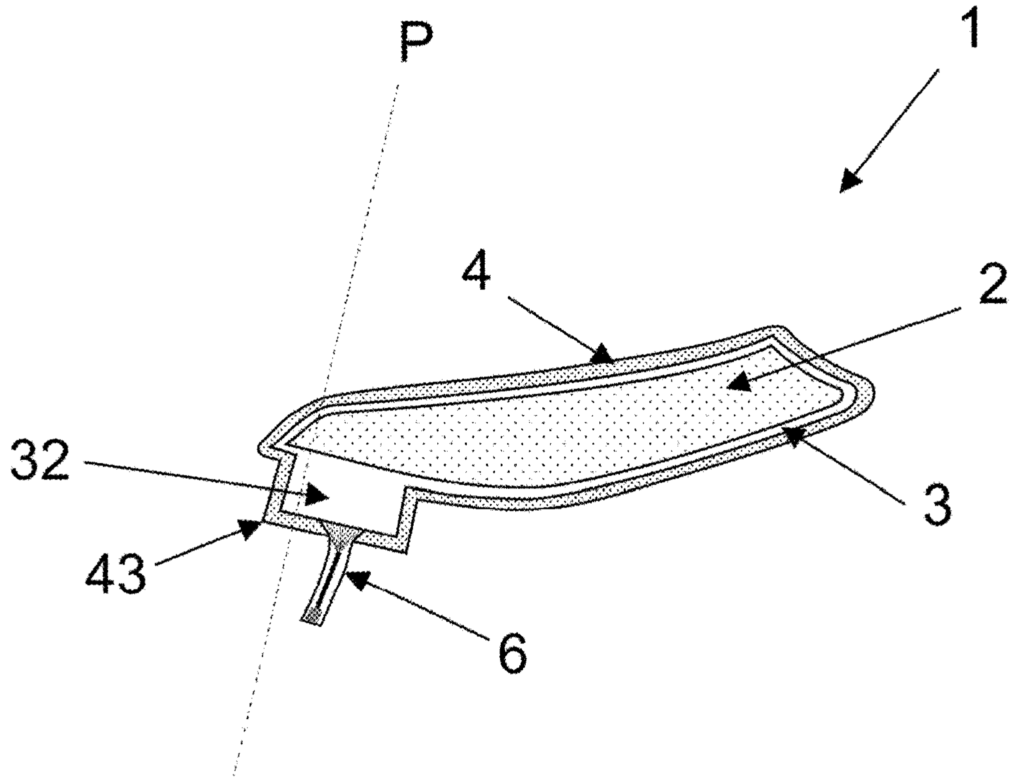
FIG. 1 shows, schematically and in part, a front view of a luminous module according to one embodiment of the invention.
Figure 2:
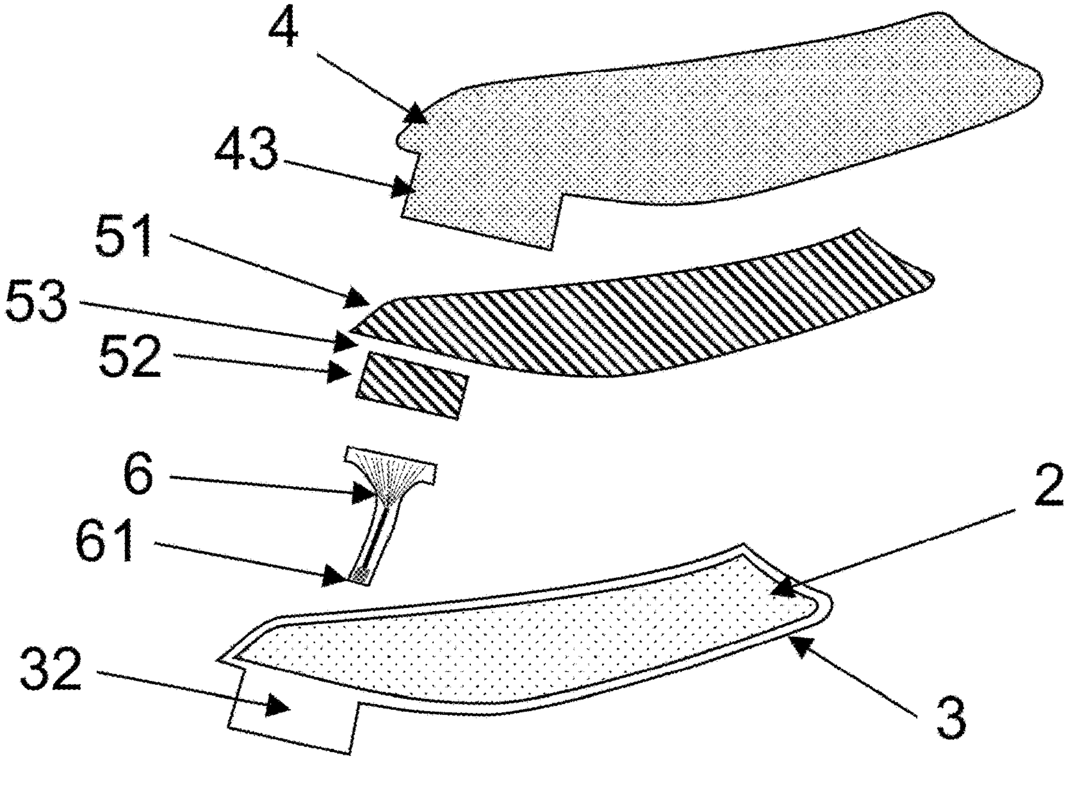
FIG. 2 shows, schematically and in part, an exploded view of the luminous module of FIG. 1.
Figure 3:
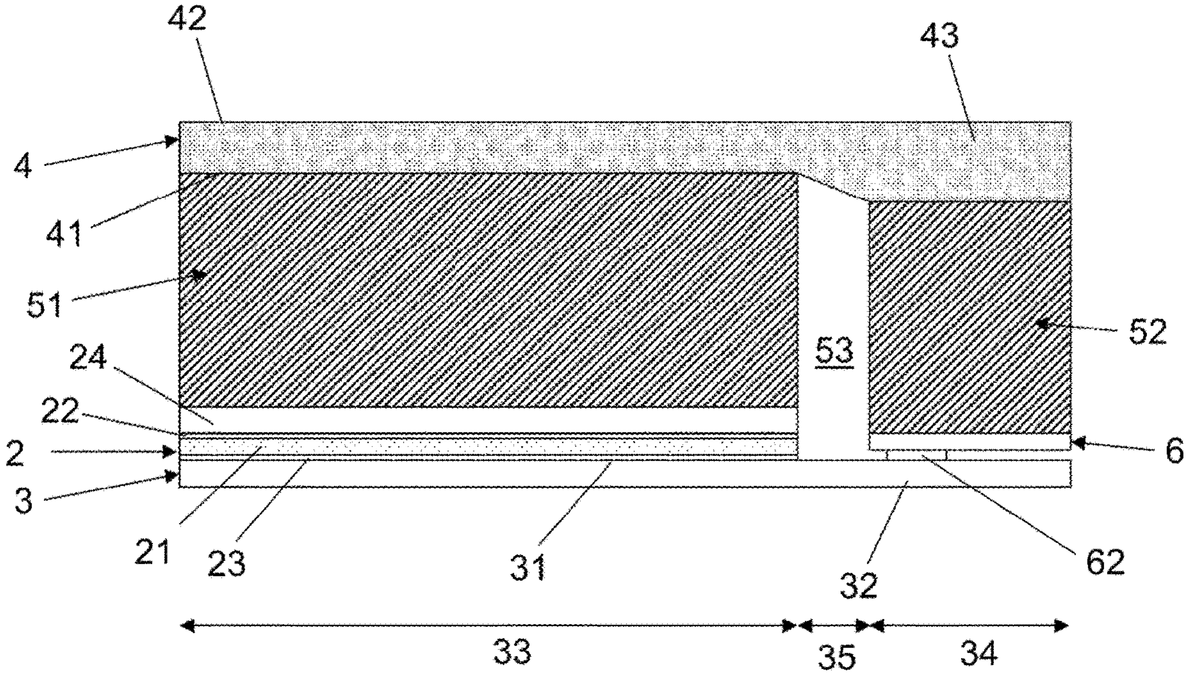
FIG. 3 shows, schematically and in part, a sectional view of the luminous module of FIG. 1.

FIG. 1 shows a front view of a luminous module 1 of a luminous and/or signaling device of an automotive vehicle, according to one embodiment of the invention. FIG. 2 shows an exploded view of the luminous module 1, while FIG. 3 shows a sectional view of the luminous module 1 through a plane P.

The luminous module 1 comprises a flexible organic light-emitting diode or OLED 2 mounted on a glass substrate 3.

More specifically, the OLED 2 is a bottom-emission OLED. It comprises an organic layer 21 surrounded by a cathode 22 made of a reflective material and an anode 23 made of transparent indium tin oxide. A thermal interface layer 24 is bonded to the cathode 22.

The glass substrate 3 is attached to the anode 23. It comprises an interconnection layer (not shown) comprising a network of electrical tracks for supplying electrical power to the OLED 2, this network being laid on the face 31 of the substrate 3 joining the OLED 2, and electrically connected to the anode 23.

When the organic layer 21 is passed through by an electric current transmitted by the substrate 3 and the anode 23, the emitting stratum emits light radiation propagating through the other strata until either reaching the anode 23, through which it passes, or until reaching the cathode 22, which reflects it in the direction of the anode 23.

The anode 23, and by extension part of the glass substrate 3, thus forms an emission face of the OLED 2.

In the example described, the thickness of the OLED 2 is substantially equal to 200 μm and the thickness of the transparent substrate is substantially equal to 100 μm, while the area of the light-emitting face could be greater than 1 $cm^2$, or even greater than 10 $cm^2$. It is thus possible to deform the OLED 2 and the glass substrate 3 to fold them, bend them or twist them, without altering the light-emitting function of the OLED 2.

In order to shape the OLED 2 and the glass substrate 3, the luminous module 1 comprises a support 4 which has a receiving surface 41 for receiving the OLED 2, of three-dimensional shape, in particular of ruled surface type, and defined according to the shape that it is desired to give to the OLED 2.

The OLED 2 is thus fastened to this receiving surface 41 of the support 4 by means of a double-sided adhesive layer 51, cut to the shape of the OLED 2. When the luminous module is mounted, a double-sided adhesive tape is thus affixed to the receiving surface 41, then cut to form the layer 51. Then the rear face of the OLED, defined by the face of the thermal interface layer 24 and opposite the emission face defined by the anode 23, is affixed to the layer 51 to fasten the OLED 2 to the support and shape it.

It should be noted that in addition to its function of shaping the OLED 2, the support 4 may also play a role in integrating the luminous module 1 into the luminous and/or signaling device. For this purpose, provision may be made to add fastening members (not shown) to the support 4, for example at a surface 42 of the support 4 opposite the receiving surface 41, such as brackets intended to be screwed or snap-fastened to a housing of the luminous and/or signaling device.

In order to supply electrical power to the network of electrical tracks etched into the face 31, the luminous module 1 comprises a flexible printed circuit board 6. This board 6 comprises at one of these ends a connector 61 intended to be connected, directly or indirectly, to a device for controlling the supply of electrical power to the OLED 2, provided in the luminous and/or signaling device.

The glass substrate 3 comprises a portion 32 extending beyond the emission face of the OLED 2. In order to electrically connect the board 6 to the network of electrical tracks, an anisotropic conductive film, or ACF, 62 is provided at that end of the board 6 opposite the end supporting the connector 61. This ACF connector 62 is thus attached to the portion 32 so as to come into electrical contact with a section of the network of electrical tracks etched on this portion 32.

However, it is necessary to prevent the board 6 from being mechanically fastened to the glass substrate 3 so as not to produce mechanical stress on the substrate 3. For these purposes, the support 4 comprises a portion 43 facing the portion 32 of the substrate 3.

The flexible printed circuit board 6 is thus mechanically fastened to this portion 43 of the support 4 by means of a double-sided adhesive layer 52.

In the example described, the layers 51 and 52 come from one and the same double-sided adhesive tape so that the process of manufacturing the module 1 is simplified. On the other hand, in this context, these layers 51 and 52 have an identical thickness, in particular of substantially 1.1 mm. However, there is a notable difference in thickness between the OLED 2 and the board 6, this producing a height difference between the OLED 2 and the board 6 with respect to the substrate 3. In order to compensate for this difference in thickness, the portion 43 of the substrate forms a step with respect to the substrate. Thus, the creation of mechanical stresses on the substrate 3 is all the more avoided.

It should also be noted that the area 33 of the substrate 3 supporting the OLED 2 and the area 34 of the portion 32 to which the board 6 is connected via the ACF connector 62 are at a distance from one other by being separated by an area 35 of this portion 32. In order to prevent corrosive components of the double-sided adhesive layer from coming to dam-age the glass substrate 3, a portion 53 of the double-sided adhesive strip situated in this area 35 has been removed during the cutting of this strip.

It should be noted that the luminous module 1 may thus participate in the performance of a given photometric function, such as a direction indicator, a position light or else a reversing light. The luminous module 1 could be used alone or in combination with other identical luminous modules 1.

The above description clearly explains how the invention makes it possible to achieve its objectives, namely providing a luminous module incorporating a flexible organic light-emitting diode and a flexible printed circuit board mechanically fastened to the module, without this fastening risking weakening the protective substrate of the diode. These objectives are achieved in particular by decoupling the electrical connection and mechanical fastening functions, and by adding a portion to the protective substrate for the electrical connection and a portion to the support of the diode for the mechanical fastening.

In any event, the invention is not limited to the embodiments specifically described in this document and extends in particular to all equivalent means and to any technically operative combination of these means. In particular, provision could be made for the protective substrate to be made of a material other than glass, in particular of transparent plastic polymer. Provision could also be made for the flexible printed circuit board to be electrically connected to the organic light-emitting diode or to the transparent substrate by means of another type of connector.

What is claimed is:

1. A luminous module of a luminous and/or signalling device of an automotive vehicle, comprising:

a. a flexible organic light-emitting diode mounted on a transparent substrate, the transparent substrate includes an interconnection layer with a network of electrical tracks for supplying electrical power to the organic light-emitting diode;

b. a support of the flexible organic light-emitting diode, the support being designed to shape at least part of the flexible organic light-emitting diode and the transparent substrate in a predetermined shape; the at least part of the organic light-emitting diode being fastened to the support by means of an adhesive;

c. a flexible printed circuit board;

wherein the transparent substrate includes a portion protruding beyond the organic light-emitting diode and facing a portion of the support, in that the flexible printed circuit board is electrically connected to the interconnection layer at this portion of the transparent substrate and in that the flexible printed circuit board is fastened to this portion of the support by means of an adhesive, wherein the adhesive fastening the flexible printed circuit board to the support is identical to the adhesive fastening the organic light-emitting diode to the support, and wherein the adhesive is a double-sided adhesive layer, and wherein the support has a first thickness in a region supporting the organic light-emitting diode and a second thickness, different from the first thickness, in the portion of the support facing the protruding portion of the transparent substrate, the second thickness accommodating a difference in thickness between the organic light-emitting diode and the flexible printed circuit board such that mechanical stress on the transparent substrate is avoided.

2. The luminous module as claimed in claim 1, wherein the double-sided adhesive layer fastening the flexible printed circuit board to the support and the double-sided adhesive layer fastening the organic light-emitting diode to the support come from one and the same double-sided adhesive tape.

3. The luminous module as claimed in claim 1, wherein the organic light-emitting diode includes a first light-emitting face, with a face of the transparent substrate covering the first light-emitting face, with the organic light-emitting diode being mounted on the support via a second face opposite the first light-emitting face, and in that the interconnection layer of the transparent substrate extends over the face of the transparent substrate situated on the side of the organic light-emitting diode.

4. The luminous module as claimed in claim 1, wherein the network of electrical tracks of the interconnection layer is laid on a face of the transparent substrate situated on the side of the organic light-emitting diode.

5. The luminous module as claimed in claim 1, wherein the flexible printed circuit board is electrically connected to the interconnection layer by means of an anisotropic conductive adhesive connector arranged between an edge of the flexible printed circuit board and the portion of the transparent substrate.

6. The luminous module as claimed in claim 1, wherein the flexible organic light-emitting diode is mounted on a first area of the transparent substrate, in that the flexible printed circuit board is electrically connected to the interconnection layer in a second area of the portion of the transparent substrate, and in that the first area and the second area are separated by a third area of the portion of the transparent substrate, the luminous module being devoid of adhesive between the support and the transparent substrate in the third area.

7. The luminous module as claimed in claim 1, wherein the portion of the support forms a step with respect to the rest of the support.

8. A luminous and/or signalling device of an automotive vehicle, comprising a luminous module, the luminous module including a flexible organic light-emitting diode mounted on a transparent substrate, the transparent substrate includes an interconnection layer with a network of electrical tracks for supplying electrical power to the organic light-emitting diode, a support of the flexible organic light-emitting diode, the support being designed to shape at least part of the flexible organic light-emitting diode and the transparent substrate in a predetermined shape, the at least part of the organic light-emitting diode being fastened to the support by means of an adhesive, a flexible printed circuit board, wherein the transparent substrate includes a portion protruding beyond the organic light-emitting diode and facing a portion of the support, in that the flexible printed circuit board is electrically connected to the interconnection layer at this portion of the transparent substrate and in that the flexible printed circuit board is fastened to this portion of the support by means of an adhesive, wherein the adhesive fastening the flexible printed circuit board to the support is identical to the adhesive fastening the organic light-emitting diode to the support, and wherein the adhesive is a double-sided adhesive layer, and wherein the support has at least two different thicknesses to accommodate a difference in thickness between the organic light-emitting diode and the flexible printed circuit board.

* * * * *